United States Patent [19]

Beall et al.

[11] 4,016,463
[45] Apr. 5, 1977

[54] HIGH DENSITY MULTILAYER PRINTED CIRCUIT CARD ASSEMBLY AND METHOD

[75] Inventors: Robert J. Beall, San Jose; Fred K. Buelow, Los Altos; John J. Zasio, Sunnyvale, all of Calif.

[73] Assignee: Amdahl Corporation, Sunnyvale, Calif.

[22] Filed: Oct. 17, 1973

[21] Appl. No.: 407,181

[52] U.S. Cl. .............................. 361/383; 361/397
[51] Int. Cl.² ........................................ H02B 1/00
[58] Field of Search .... 317/101 C, 101 R, 101 CC, 317/101 CM, 100; 174/68.5

[56] References Cited

UNITED STATES PATENTS

| | | | |
|---|---|---|---|
| 3,300,686 | 1/1967 | Johnson et al. | 317/101 CM |
| 3,564,114 | 2/1971 | Blinder | 317/101 B |
| 3,629,730 | 12/1971 | Penzel et al. | 317/101 CM |
| 3,680,005 | 7/1972 | Jorgensen et al. | 317/101 CM |
| 3,726,002 | 4/1973 | Greenstein et al. | 317/101 CM |

FOREIGN PATENTS OR APPLICATIONS 1,220,370  1/1971  United Kingdom ........ 317/101 CM

*Primary Examiner*—David Smith, Jr.
*Attorney, Agent, or Firm*—Flehr, Hohbach, Test, Albritton & Herbert

[57] ABSTRACT

A high density multilayer printed circuit card assembly having plated through holes in electrical contact with the layers of conducting metal. The card is provided with bonding pads in contact with the plated through holes whereby wiring may be selectively utilized to form interconnections for components carried by the card. Signal lines are brought to the surface so that they can be interrupted and changes be made by wiring. Components of various types are arranged in rows to facilitate cooling.

4 Claims, 13 Drawing Figures

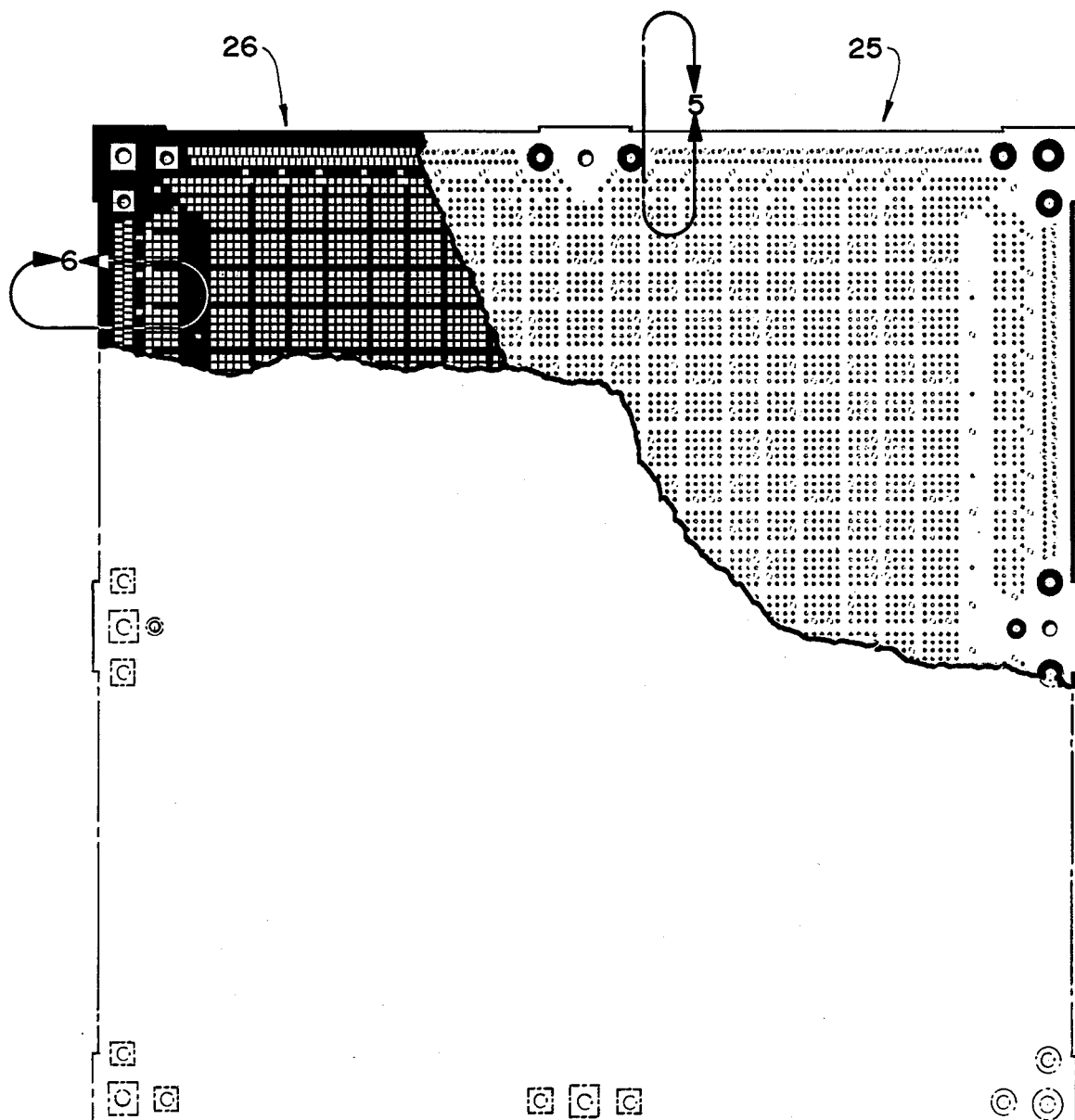
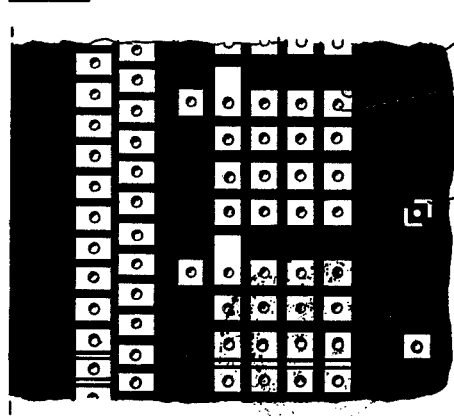
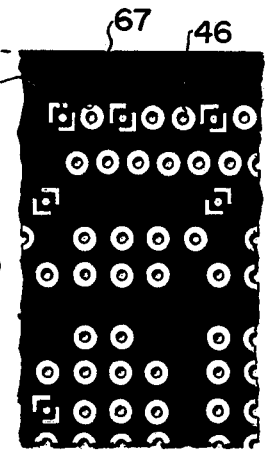
FIG.-4
FIG.-6
FIG.-5

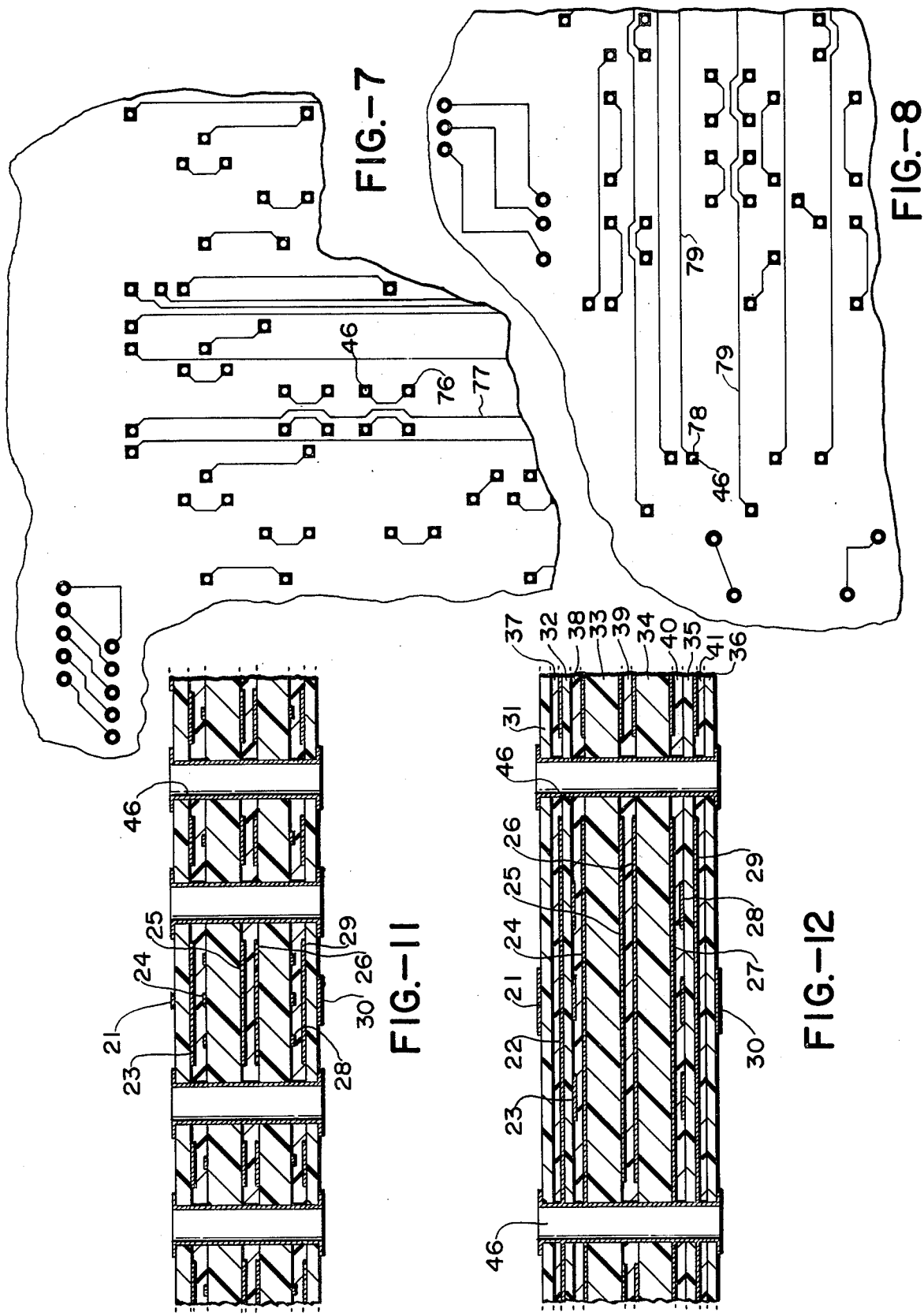

HIGH DENSITY MULTILAYER PRINTED CIRCUIT CARD ASSEMBLY AND METHOD

BACKGROUND OF THE INVENTION

The present invention relates to printed circuit cards and more particularly to a printed circuit card which can be utilized in conjunction with a central processing unit of a large scale computer. Printed circuit cards or boards have heretofore been provided. However, such printed circuit cards in the past have not had the requisite capability for mounting LSI chip carriers and their associated components to provide a high density of electrical components. In addition, there have been inadequate capabilities for making engineering changes and the like on such printed circuit boards. There is therefore a need for a new and improved printed circuit board assembly and a method for making the same.

SUMMARY OF THE INVENTION AND OBJECTS

The card assembly consists of a plurality of layers of insulating material and a plurality of layers of conducting metal which are carried by the layers of insulating material. The layers of insulating material with the layers of metal thereon are bonded together to form a laminated card having first and second parallel planar major outer surfaces. Each of the layers has a predetermined pattern. A plurality of plated through holes extend through the card and are in electrical contact with portions of the layers and are carried by the card. One of the layers of conducting metal is disposed on the first major surface and serves as a component side of the card and another of the layers of conducting metal is disposed on the second major surface and serves as a wire bonding side of the card. The layer on the component side is formed with contact pads in electrical contact with the plated through holes and the layer on the wire bonding side is provided with bonding pads electrically connected to the plated through holes whereby the contact pads can be wired independently of the layers of metal carried by the card. Layers having signal lines are provided. The signal lines are brought to the second major surface by the plated through holes and means is provided for interrupting the signal lines on the surface so that the signal lines can also be wired independently of the metal layers carried by the card.

In general, it is an object of the present invention to provide a card assembly which is of the multilayer type and has high density capabilities.

Another object of the invention is to provide an assembly of the above character which makes it possible to mount components in spaced parallel rows.

Another object of the invention is to provide an assembly of the above character in which cooling is provided in such a manner so that the heat from each of the components is moved in parallel paths so the heat from one type of component will not mix with the other type of components.

Another object of the invention is to provide an assembly and method of the above character in which the components include LSI chip carriers which are mounted so that the heat from the other components will not come into significant contact with the LSI chip carriers.

Another object of the invention is to provide an assembly of the above character in which the voltage and ground conductors are carried on separate planes.

Another object of the invention is to provide an assembly and method of the above character in which the resistance of the voltage and ground planes has a predetermined ratio in order to reduce circuit noise tolerances.

Another object of the invention is to provide an assembly and method of the above character in which the components are arranged so that they will not block the air flow over the LSI chip carriers.

Another object of the invention is to provide an assembly and method of the above character in which the plated through holes are provided in the card.

Another object of the invention is to provide an assembly and method of the above character in which contact pads on one side of the card and bonding pads on the other side of the card are in electrical contact with the plated through holes so as to make possible external wiring between the contact pads by use of the bonding pads.

Another object of the invention is to provide an assembly and method of the above character in which certain of the layers carry signal lines and wherein the signal lines are electrically connected to certain of the plated through holes.

Another object of the invention is to provide an assembly and method of the above character in which the signal lines can be interrupted on the surface to facilitate engineering changes.

Another object of the invention is to provide an assembly and method of the above character in which the signal lines include bonding pads on the surface which can be utilized for making external wire connections for the signal lines.

Another object of the invention is to provide an assembly and method of the above character in which certain of the plated through holes serve as via holes which are arranged to facilitate interconnection of the components.

Another object of the invention is to provide an assembly and method of the above character in which there is provided a ground pad for every signal pad so that a transmission line type connection can be made for the signal lines.

Another object of the invention is to provide an assembly and method of the above character in which signal lines on adjacent layers are disposed at approximately 90° with respect to each other to minimize electrical noise coupling between the same.

Additional objects and features of the invention will appear from the following description in which the preferred embodiments are set forth in detail in conjunction with the accompanying drawings.

BRIEF DESCRIPTION OF THE DRAWINGS

FIG. 4 is a plan view with certain portions broken away of the card showing the voltage and ground layers.

FIG. 5 is a portion of the printed card encircled by the line 5—5 of FIG. 4.

FIG. 6 is an enlarged view showing a portion of the card shown in FIG. 4 encircled by the line 6—6 of FIG. 4.

FIG. 7 is a partial view of one of the planes carrying signal lines.

FIG. 8 is a partial view of another of the planes connecting signal lines.

FIG. 11 is a cross sectional view of a portion of a printed circuit card incorporating the present invention having eight metal conducting layers.

FIG. 12 is a cross sectional view of the printed circuit card assembly incorporating the present invention having ten metal conducting layers.

DESCRIPTION OF THE PREFERRED EMBODIMENT

Figure 1:
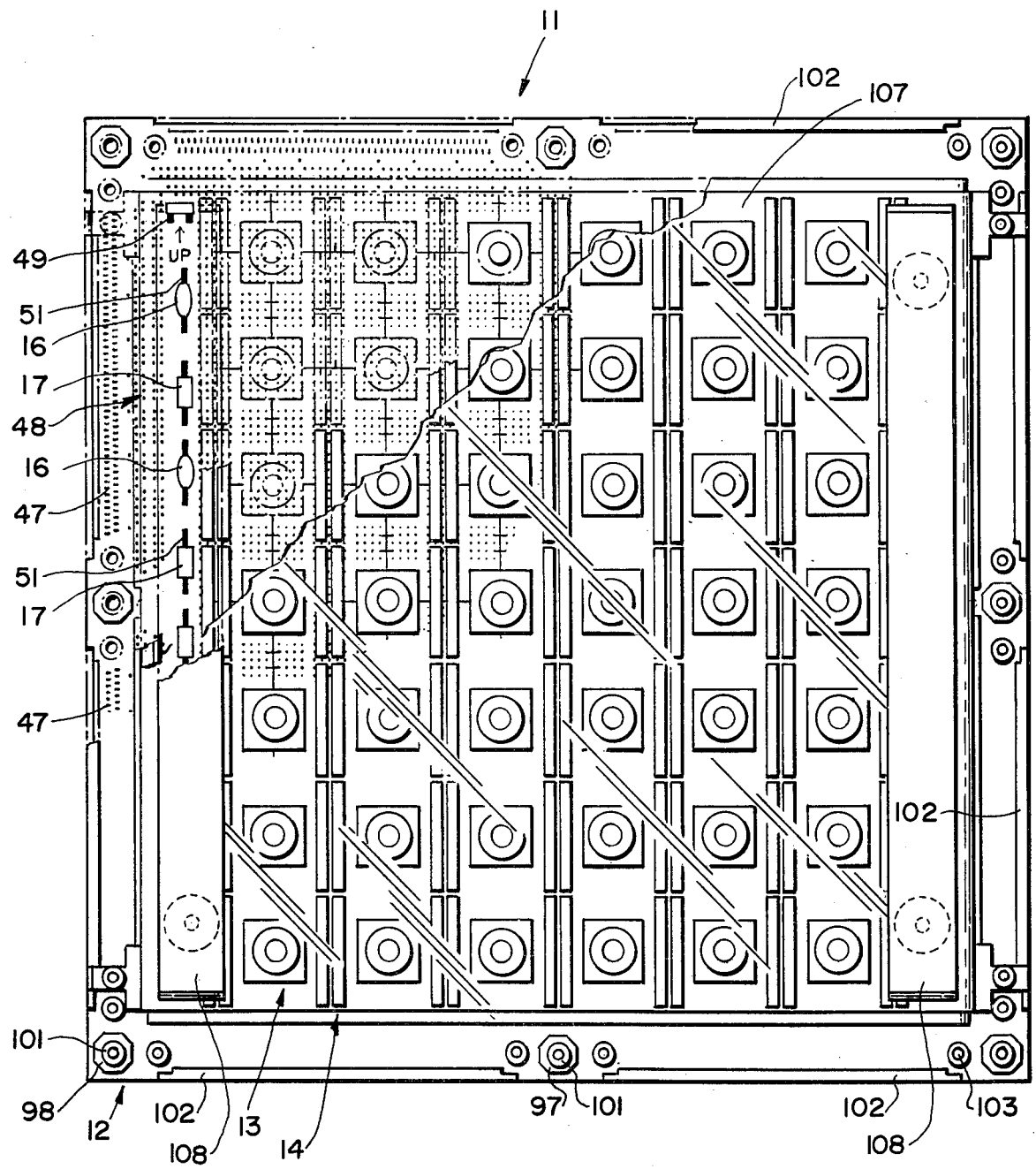
FIG. 1 is a plan view with certain portions broken away of a high density multilayer printer circuit card assembly incorporating the present invention.

The printed circuit board assembly 11 which is shown in the drawings is particularly adapted for use with a central processing unit, hereinafter called the CPU which forms a major portion of a large scale computer as described in copending application Ser. No. 407,251, filed Oct. 17, 1973 now U.S. Pat. No. 3,903,404. As described therein, each printed circuit board assembly 11 is a multi chip carrier card assembly, hereinafter referred to as MCC card assembly.

The MCC card assembly 11 consists of an MCC card 12 which is a laminated multi-layer type as hereinafter described. The MCC card 12 as shown in the drawing has a capability of mounting up to 42 LSI (large scale integration chip packages 13 of the type described in copending application Ser. No. 270,448, filed July 10, 1972 abandoned in favor of Ser. No. 534,853, filed Dec. 20, 1974. The MCC card is generally rectangular and, as hereinafter described, the pattern provided on the MCC card permits mounting of the LSI chip carriers 13 in a rectangular pattern with seven of the carriers in a row and with six spaced parallel rows. The MCC card 12 also has the capability of mounting a plurality of R-packs or resistor packs 14. The resistor packs 14 are mounted in pairs symmetrically on either side of each of the LSI chip carriers so that they are parallel and spaced apart with two rows of resistor packs on opposite sides of each of the LSI chip carrier 13. Each of the R-packs is provided with a power lead and a ground lead and each has 10 resistors which serve as terminating resistors for the circuits in the chip carriers 13. As explained in said copending application Ser. No. 270,448, filed July 10, 1972 abandoned in favor of Ser. No. 534,853, filed Dec. 20, 1974, the MCC cards 12 are disposed so that they lie in vertical planes with the rows of chip carriers 13 and the rows of resistor packs also disposed vertically to permit the flow of cooling air over the resistor packs and over the chip carriers. By mounting the resistor packs 14 in the manner shown, there is a capability of mounting ninety-eight resistor packs on each MCC card. There is also a capability of mounting on each of the MCC cards a plurality of capacitors which are normally used for decoupling. Thus, capacitors 16 and 17 are mounted in two vertical rows spaced and parallel to the rows of the chip carriers 13 and the resistor packs 14 adjacent the opposite side extremities of the MCC card.

Figure 10:
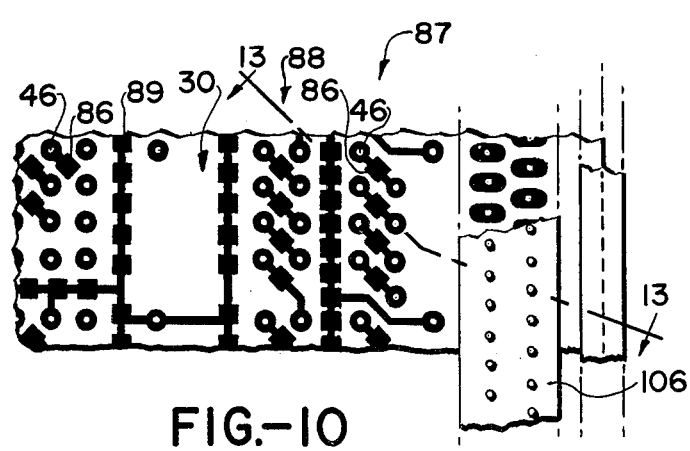
FIG. 10 is an enlarged view showing a portion of the card in FIG. 9 encircled by the line 10—10.

The MCC card includes the desired number of layers as, for example, eight layers shown in FIG. 11 or 10 layers shown in FIG. 12. These layers can be designated as follows:

| Layer | Designation of Layer |
| --- | --- |
| 21 | Chip carrier pattern |
| 22 | Y signal pattern |
| 23 | X signal pattern |
| 24 | Y signal pattern |
| 25 | $V_{cc}$ or ground plane pattern |
| 26 | $V_{ee}$ or voltage plane pattern |
| 27 | X signal pattern |
| 28 | Y signal pattern |
| 29 | X signal pattern |
| 30 | Wire bond pattern |

These conducting layers 21 through 30 are formed of a suitable conducting material such as copper. These layers are formed on epoxy glass layers 31 through 36 of various thicknesses as shown in a suitable manner such as by photoprinting and the like. Disposed between the layers 31 through 36 are layers 37 through 41 which are formed of pre-impregnated epoxy glass layers. These layers are all assembled in the order shown in the drawings in FIG. 11 and FIG. 12 and are baked at a suitable temperature so that there is provided a laminated multi-layer epoxy glass printed circuit card or board. The formation of laminated printed circuit boards is well known to those skilled in the art and thus will not be described in detail. In addition, there are provided a plurality of holes 46 in the MCC card which have been plated in a manner well known to those skilled in the art to provide what is commonly called "plated through" holes. These plated through holes make contact with certain of the metal layers 21 through 30 for purposes hereinafter described.

By way of example, the MCC card can have outer dimensions such as 7 inches square with a thickness of approximately 0.07 inches. Thus for each board there are provided two outer layers and a plurality of buried layers ranging from six to eight or more with one ground layer ($V_{cc}$) and one power or voltage layer ($V_{ee}$ at −5.2 volts) and with the remaining being signal layers as, for example, four or six signal layers. Layer to layer interconnections are accomplished through the plated through holes 46 having diameters of 0.016 inches.

Figure 2:
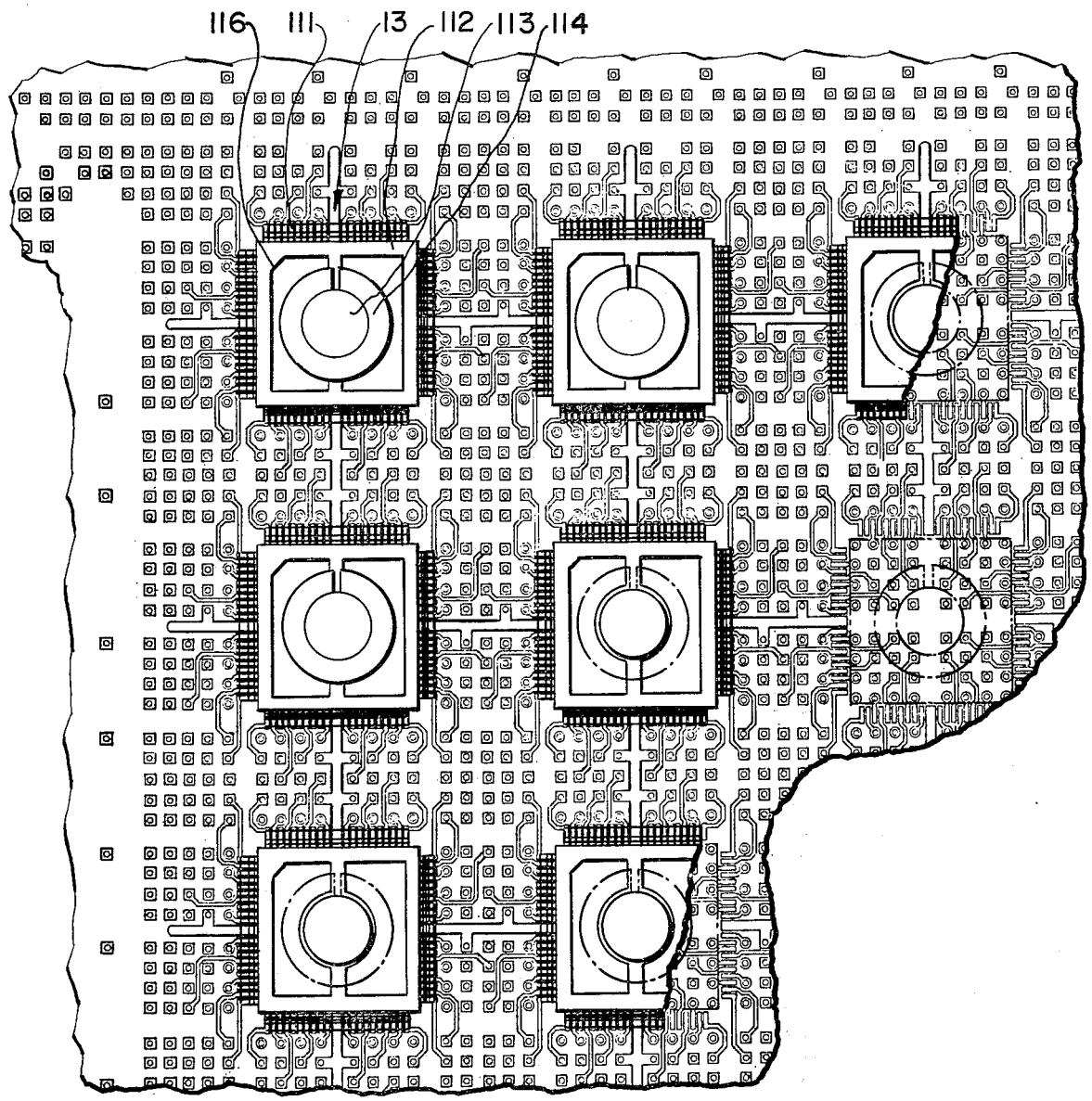
FIG. 2 is an enlarged partial view of a portion of the printed circuit card assembly showing the component side.
Figure 3:
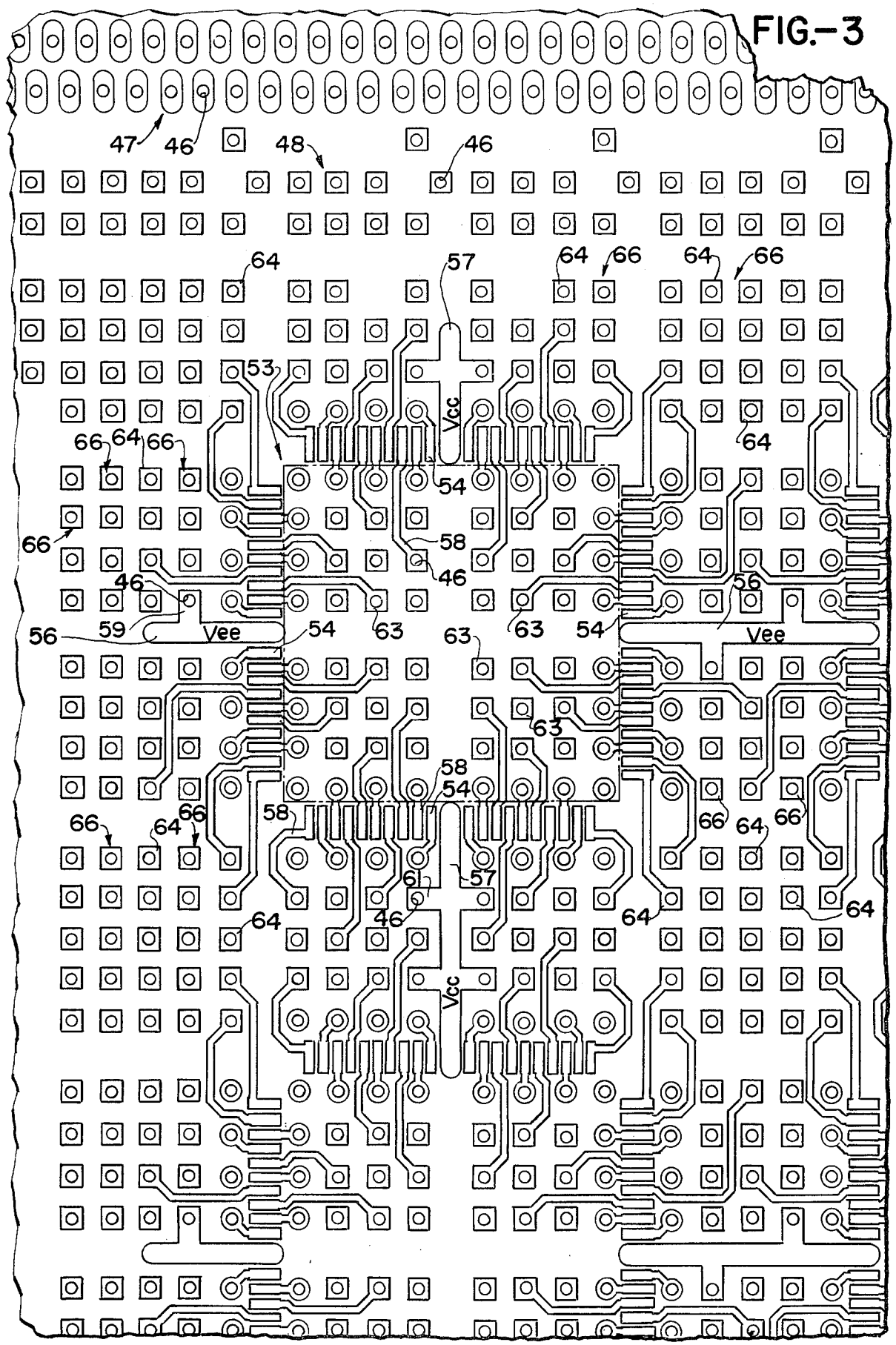
FIG. 3 is a still further enlargement of a portion of the component side of the printed circuit card.

The detail of the chip carrier pattern 21 is shown in FIGS. 1, 2 and 3. As shown therein, these are provided eight sets 47 of the plated through holes 46 on each MCC card with two sets being disposed on each side in vertical alignment. Each set 47 consists of two rows of spaced parallel holes which are adapted to receive the pins of a connector (hereinafter described). Fifty holes are provided in each of the rows of each sets so that a total of one hundred holes is provided for use with each connector. The sets 47 of holes are adjacent to the outer margin of the MCC card 12 as shown in FIG. 11. An additional set 48 of holes 46 is provided adjacent each of the sets 47 but is spaced farther inwardly from the outer margin of the board. These sets 48 include a plurality of holes namely three for each of the holes 46 in the sets 47 so that changes can be made in the MCC card as hereinafter described.

Rectangular pads 41 and T-shaped pads 52 are formed in the pattern 21 and are provided in two spaced vertical rows adjacent the sets 48. The pads 49 and 51 can be used for a general purpose pads or for mounting different types of capacitors. By way of example, a large chip-type capacitor could be soldered directly to the pads by forming fillets of solder. Each of the pads is provided with a plated through hole 46 which extends through the pad so that capacitors having wire leads thereon can be utilized in conjunction therewith.

For each of the LSI chip carriers 13, there is provided a rectangular area 53 which is shown in broken lines in FIG. 3. The broken line area represents the area which is covered by the LSI chip carrier 13 when it is mounted on the MCC card. Immediately adjacent the four sides of the rectangular area 53 there are provided 10 spaced parallel pads 54 having suitable dimensions such as 10 × 40 mils which are immediately adjacent the broken line rectangular area 53 so that there are provided in total eighty signals pads 54. Intermediate the sides of the rectangular area 53 there are provided two $V_{ee}$ pads 56 and two $V_{cc}$ pads 57 so that in total for each LSI chip carrier 13 there are provided 84 pads. As shown in FIG. 3, for the areas 53 adjacent the edge of the MCC card the pads 56 and 57 facing the edges are one-half as long as the others since they are not shared with adjacent areas 53 as are the longer pads 56 and 57. The pads 54 are connected by links 58 to plated-through holes 46 and some of the pads 56 are connected by links 59 to plated-through holes 46 and pads 57 are connected to plated-through holes 46 by links 61. It will be noted that the links 59 and 61 are wider and heavier than the other links because of the greater current carrying capabilities required of them.

The MCC card is provided with in excess of 10,000 plated through holes 46. The plated-through holes are arranged in a predetermined pattern. As pointed out above, the pads provided for each of the LSI chip carriers 13 are arranged around the rectangular area 53 and are connected by the links 58, 59 and 61 to pads having plated-through holes 46 extending therethrough. As can be seen from FIG. 3, many of these pad links and pads are outside of the rectangular area 53 whereas others are within the rectangular area 53. It will be noted by examining FIG. 3 that a plurality of pads 63 having plated-through holes 46 therein are unused (i.e., no links are connected to the pads) within the confines of the rectangular area 53. These pads 63 are aligned in rows which are centered on lines which pass through the corners of the rectangular area 53. Thus, the pads 63 on the major diagonals of the rectangular area 53 are not utilized for signal connections and are left unused. In addition, there are a plurality of pads 64 which are disposed outside the areas 53 but adjacent the four corners of each of the rectangular areas 53 which have plated-through holes 46 also extending through the same. It has been found that by leaving the pads 63 on the major diagonals of the squares or areas 53 open and by providing patterns of pads 64 outside the rectangular areas 53 but adjacent the corners thereof it is possible to achieve excellent wire bonding capabilities where required as, for example, to make engineering changes or to make special circuit arrangements on the MCC card. These unused pads 63 and 64 with the plated-through holes 46 therein can be termed vias as that term is hereinafter used.

There also are provided two sets or rows of pads 66 having plated through holes 46 extending therethrough which are utilized for mounting the R-packs 14. Thus there are provided two of such rows of pads 66 on the two opposite vertical sides of each LSI chip carrier 13 for mounting of the R-packs 14. Even though the R-packs are mounted in facing pairs, it is possible to utilize the same R-pack.

The layers representing the ground and voltage planes are shown in FIG. 4 and identified by the numbers 25 and 26, respectively. In the ground plane, the light areas are copper whereas in the voltage plane 26, the dark areas are copper. In comparing the layers 25 snd 26 it can be seen that the layer 25 contains considerably more surface area of copper than does the voltage plane layer 26. This has been done to establish a predetermined ratio of resistance between the ground and voltage planes for purposes described in copending application Ser. No. 270,449, filed July 10, 1972 now U.S. Pat. No. 3,808,475. FIGS. 5 and 6 show the manner in which plated-through holes 46 extend through the planes and are connected to the planes or are isolated from the planes. From FIG. 5 it can be seen that most of the plated-through holes 46 do not make contact to the ground plane 25 because they are surrounded by circular areas 67 in which no copper is present. Only the plated-through holes 46 which are surrounded by broken square areas 68 are connected to the ground plane 25. The areas 68 are broken to provide spaces for copper to be present, i.e., in two opposite corners of each area 68 and in the center of the areas 68 to connect to the plated-through holes 46. The broken square areas 68 are free of copper and serve as thermal barriers to inhibit heat transfer from the plated-through holes 46 during soldering operations. From FIG. 6 it can be seen that most of the plated-through holes 46 are not connected to the voltage plane 26 because they are surrounded by rectangular areas 69 which are free of copper. The other plated-through holes 46 are connected to the voltage plane 46 through the broken square areas 70 which serve the same purpose as the broken square areas 68.

FIGS. 7 and 8 are representative of the signal planes 23 through 24 and 27 through 29, with FIG. 7 representing a Y-signal plane and FIG. 8 representing an X-signal plane. It will be noted that the principal signal wiring in each of the signal planes runs at 90° angles with respect to the signal wiring on the next adjacent plane to minimize coupling between signals carried by the wires on adjacent planes.

Each X-signal plane is provided with a plurality of pads 76 having plated through holes 46 extending therethrough with vertical conducting leads 77 interconnecting the same as shown in FIG. 7. Similarly each Y-signal plane as shown in FIG. 8 is provided with pads 78 having plated-through holes 46 extending therethrough and which are connected by horizontal leads 79.

Figure 9:
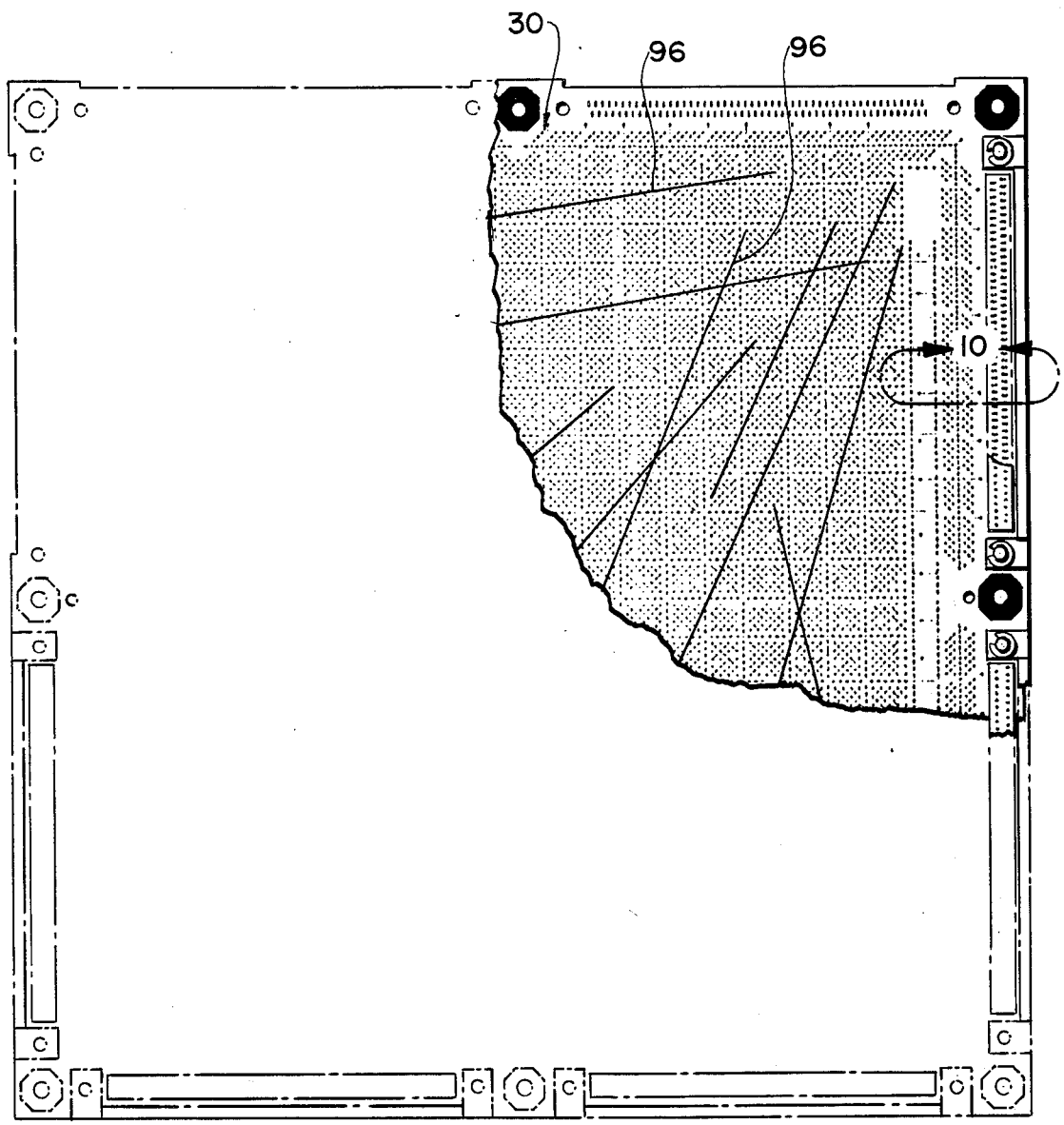
FIG. 9 is a view of the printed circuit card with portions broken away showing the wire bonding side.

In FIGS. 9 and 10, there is shown the wire bond pattern 30. In this pattern there are a large number of pads 86 that are provided for bonding purposes and which are connected to the plated-through holes 46 as shown. The pads 86 which are in rows 87 and 88 can be termed input/output engineering change pads and are utilized for purposes hereinafter described. In addition, for each of the plated through holes 46 which is connected to the pads 54 on the chip carrier pattern 21 adapted to be connected to LSI chip carrier 13 there is provided a pad 86 as, for example, shown on the left hand side of FIG. 10. This makes it possible, if necessary, to be able to contact each lead of an LSI chip carrier 13 from the wire bond pattern side. In addition, in the pattern 30 there is provided a plurality of interconnected ground pads 89. These ground pads are arranged in a repeating rectangular pattern.

From the foregoing arrangements of the patterns in the various planes in conjunction with the plated through holes and the pads connected thereto, it is possible to externally wire any one or more of the signal paths even though a major portion of the signal paths or lines are buried within the MCC card. This makes it possible to readily repair the MCC cards or make engineering changes on the same without the necessity of destroying the card.

When it is desired to make interconnections between certain of the pads, twin lead wire is soldered to the pads and is extended over the back side of the MCC card and then soldered to the other pad to provide a plurality of twin leads 96 as shown in FIG. 9. For purposes of illustration, only a few of the twin leads 96 have been shown and these represent only typical interconnections.

In order to accomplish such bonding, the bonding pads 86 are 30 mils square and carry 1 mil of eutetic solder and are then coated with polyurethane. The MCC card has been designed so that the buried signal lines as well as the twin lead wire 96 have a characteristic impedance of approximately 90 ohms. It has been found that the propagation velocity in the printed lines is 5.5 inches per nanosecond while in the twin lead wire, the propagation velocity is 8.0 inches per nanosecond.

In general, the twin lead wires are utilized where long runs are required on the MCC card or where they cannot be printed and for engineering change wiring. In a typical MCC card, approximately 80% of these signal connections will be in the printed lines buried in the MCC card whereas the remaining 20% or approximately 500 wires will be solder bonded twin lead wires. This 20% corresponds to more than 50% of the total wire length on each MCC card.

The signal connections on and off the MCC card are provided through the 800 pin socket connections on 0.025 inch centers placed on the card perimeter with 200 adjacent each edge of the card and with 100 for each of the two connectors for each side of the card.

Figure 13:
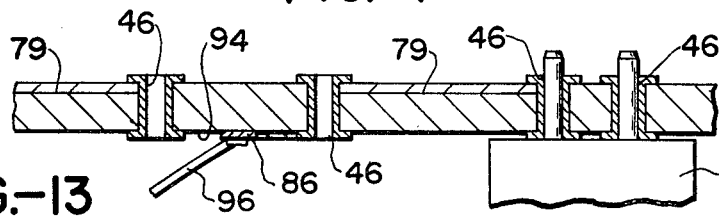
FIG. 13 is a cross sectional view of a portion of the printed circuit card showing the manner in which signal lines are brought to the surface and can be interrupted for making external wiring changes.

When it is desired to make an engineering change on the MCC card, such operations are carried out on the wire bond pattern 30. For example, as shown in FIG. 13 assuming that an internal connection is made within the MCC card between the plated through hole 46 through which one of the connectors 106 extends and a signal line 79, an engineering change can be accomplished because of the I/O input change pads 86 provided in rows 87 and 88. Where it is desired to make such a change, the printed circuit line extending from the pad 86 to the plated through hole 46 is cut in a suitable manner such as a sharp pointed instrument as indicated at 94 in FIG. 13. This will interrupt the conventional signal path. Then one of the leads of the twin lead 96 is taken and the end of it soldered to the pad 86 in the manner indicated in FIG. 13. The other end of the lead can then be connected to the appropriate pad on the MCC card. The other lead of the twin lead 96 is connected to appropriate ground pads. The twin lead 96 is sufficiently small so that, if desired, one or both of the leads can be extended through the plated through holes 46 which then serve as vias for the wire. Thus a connection can be made from a pad on the wire bond pattern 30 with a twin lead 96 and then extended through one of the vias and be bonded to a pad of the chip carrier pattern 21 on the other side of the MCC card. It thus can be seen that the MCC card is constructed in such a manner that it gives great versatility in wiring of the MCC card and for making engineering changes and doing repairs when necessary.

The MCC card 12 is provided with large ground terminals 97 intermediate the ends of the card on each side and with large voltage terminals 98 at each corner and having screws 101 extending through so that the MCC cards can be secured to voltage and ground posts as described in said copending application Ser. No. 407,251, filed Oct. 17, 1973 now U.S. Pat. No. 3,903,404. A pair of stiffeners 102 are provided on each side of the four sides of the MCC card. A pair of cap screws 103 are associated with each of the stiffeners and are utilized for making and breaking connections between connectors 106 carried by the MCC card and other connectors as described in copending application Ser. No. 407,251, filed Oct. 17, 1973 now U.S. Pat. No. 3,903,404. As also described in said copending application Ser. No. 407,251, filed Oct. 17, 1973 now U.S. Pat. No. 3,903,404, each MCC card is provided with a transparent cover 107 which has a pair of spaced apart handles 108 mounted thereon.

As shown in FIG. 2, each of the LSI chip carriers 13 is provided with 84 leads 111 which are adapted to mate with the bonding pads 54 surrounding the rectangular areas 53 in which it is to be mounted. Permanent connection is accomplished by soldering the leads 111 to the pads 54. As shown in FIG. 2 and as described in copending application Ser. No. 270,449, filed July 10, 1972 now U.S. Pat. No. 3,808,475, each of the LSI chip carriers 13 includes a ceramic base 112 in which there is mounted an LSI chip. A cooling stud 113 is mounted on the base 112 and extends outwardly therefrom. The cooling stud is provided with cooling fins 114. The base is provided with an orientation mark 116 so that the chip carrier will be properly oriented on the MCC card.

As pointed out previously, each MCC card is capable of receiving 42 LSI chip carriers 13. In addition, each MCC card is capable of receiving 98 resistor packs and 20 capacitors of various types.

It is apparent from the foregoing that there has been provided a printed circuit card assembly which has many features and advantages. The card is of a type which has a high packing density and, as pointed out above, is capable of carrying many LSI chip carriers, resistor packs, capacitors and the like. The printed circuit card is arranged so that adequate cooling can be provided for the LSI chip carriers and the resistor packs. The heat given off by the resistor packs will not pass over the LSI chip carriers. The printed circuit board or card is provided with many plated through holes which are connected to the contact pads and the bonding pads so that external wiring connections can be readily made when desired. In addition, the internal signal lines are brought to the surface through via holes and are provided with connections on the surface which can be interrupted to permit engineering changes and external wiring where desired. Additional via holes are provided having unique arrangements facilitating interconnection of the various components carried by the printed circuit card or board assembly.

The construction of the board is also such that the components can be readily secured thereto and external wiring can be provided where necessary.

We claim:

1. In a high density multi-layer printed circuit card assembly, a plurality of layers of insulating material, a plurality of spaced layers of conducting metal carried by said layers of insulating material, said layers of insulating material and said layers of conducting metal being laminated to form a card having first and second parallel planar major outer surfaces, said layers of metal having predetermined patterns, said card having a plurality of plated through holes extending through said card, said layers of conducting metal having portions in electrical contact with said plated through holes, one of said layers of conducting metal being disposed on said first major surface and serving as the component side of the card, another of said layers of conducting metal being disposed on said second major surface and serving as the wire bonding side of the card, said layer of conducting metal on the component side being formed with contact pads electrically connected to said plated through holes, a plurality of LSI chip carriers, each of said LSI chip carriers having signal, voltage and ground leads extending outwardly therefrom in a predetermined pattern and having their outer extremities lying in a plane, said layer of conducting metal on the component side also being formed with a plurality of signal, voltage and the ground pads arranged in predetermined patterns corresponding to the predetermined pattern of the outer extremities of the leads of the LSI chip carriers, said layer of conducting metal on the component side including connecting links for connecting the signal, voltage and ground pads to the contact pads, means connecting the leads of the LSI chip carriers to said signal, voltage and ground pads with the LSI chip carriers lying in a plane generally parallel to the card, said LSI chip carriers having cooling studs extending outwardly therefrom in a direction perpendicular to and away from the plane of the card, said LSI chip carriers being mounted in spaced parallel rows, a plurality of resistor packs mounted on said card in spaced parallel rows between said LSI chip carriers, and a cover secured to said card and overlying the component side of the card to provide an air channel between the card and the cover for the passage of air over the LSI chip carriers and the resistor packs in a direction parallel to the rows of LSI chip carriers and resistor packs wiring separate from the layers of metal carried by the card on the wire bonding side of the card for electrically interconnecting certain of the contact pads and serving to interconnect the LSI chip carrier into operative circuitry.

2. A printed circuit card assembly as in claim 1 wherein the wires are in the form of twin leads and wherein said plated through holes are sufficiently large so that the twin leads can extend through the plated through holes to make it possible to make connections between the contact pads on the component side of the card and the contact pads on the wiring side of the card.

3. A printed circuit card assembly as in claim 1 wherein said signal voltage and ground pads are arranged in rectangular areas on said card and wherein contact pads for each area are provided inside and outside of each area.

4. A printed circuit card assembly as in claim 3 wherein certain of said contact pads are provided on diagonals of the rectangular areas to provide excellent wire bonding capabilities for the printed circuit card assembly.

* * * * *